US008822913B2

(12) United States Patent
Graupera et al.

(10) Patent No.: US 8,822,913 B2
(45) Date of Patent: Sep. 2, 2014

(54) INDUCTIVELY-COUPLED PLASMA ION SOURCE FOR USE WITH A FOCUSED ION BEAM COLUMN WITH SELECTABLE IONS

(75) Inventors: Anthony Graupera, Hillsboro, OR (US); Charles Otis, Hillsboro, OR (US)

(73) Assignee: FEI Company, Hillsboro, OR (US)

(*) Notice: Subject to any disclaimer, the term of this patent is extended or adjusted under 35 U.S.C. 154(b) by 315 days.

(21) Appl. No.: 13/312,704

(22) Filed: Dec. 6, 2011

(65) Prior Publication Data

US 2013/0140450 A1    Jun. 6, 2013

(51) Int. Cl.
- H01J 27/16    (2006.01)
- H01J 27/02    (2006.01)
- H01J 49/26    (2006.01)
- B01D 59/44    (2006.01)

(52) U.S. Cl.
USPC .... 250/281; 250/282; 250/396 R; 250/423 R; 250/492.21; 250/492.3; 315/111.21; 315/111.81; 156/345.41; 201/298.38; 118/723 R

(58) Field of Classification Search
USPC ......... 250/251, 281, 282, 294, 296, 298, 306, 250/307, 309, 310, 396 R, 396 ML, 423 R, 250/424, 492.1, 492.2, 492.21, 492.22, 250/492.3, 493.1; 315/111.21, 111.31, 315/111.41, 111.51, 111.81, 176; 156/345.33, 345.34, 345.35, 345.42, 156/345.46, 345.48; 118/50.1, 723 E, 723 R, 118/723 ER, 723 I, 723 IR; 204/192.3, 204/192.32, 192.34, 192.35, 298.07, 204/298.33; 257/E21.252, E21.256; 216/63, 67

See application file for complete search history.

(56) References Cited

U.S. PATENT DOCUMENTS

| | | | |
|---|---|---|---|
| 4,737,637 A | 4/1988 | Knauer | |
| 4,755,685 A * | 7/1988 | Kawanami et al. | 250/492.2 |
| 4,789,787 A | 12/1988 | Parker | |
| 5,165,954 A * | 11/1992 | Parker et al. | 430/5 |
| 5,188,705 A * | 2/1993 | Swanson et al. | 204/192.34 |
| 5,965,034 A * | 10/1999 | Vinogradov et al. | 216/68 |
| 6,516,742 B1 * | 2/2003 | Blalock et al. | 118/723 I |
| 7,166,233 B2 | 1/2007 | Johnson et al. | |
| 7,241,361 B2 * | 7/2007 | Keller et al. | 156/345.48 |
| 7,670,455 B2 | 3/2010 | Keller et al. | |
| 7,745,780 B2 * | 6/2010 | McLean et al. | 250/282 |
| 7,947,951 B2 * | 5/2011 | Khursheed | 250/305 |
| 7,952,083 B2 | 5/2011 | Shichi et al. | |
| 7,993,813 B2 * | 8/2011 | Scott et al. | 430/296 |
| 8,076,650 B2 | 12/2011 | Smith et al. | |

(Continued)

FOREIGN PATENT DOCUMENTS

| | | |
|---|---|---|
| JP | H05-290800 | 11/1993 |
| JP | 2000-149843 | 5/2000 |

OTHER PUBLICATIONS

J. Hopwood, [split_Faraday_shield.pdf], Plasma Sources Sci. Technol. 1 (1992) 109-116.*

(Continued)

*Primary Examiner* — Bernard E Souw
(74) *Attorney, Agent, or Firm* — Scheinberg & Associates, PC; Michael O. Scheinberg

(57) ABSTRACT

An inductively coupled plasma source having multiple gases in the plasma chamber provides multiple ion species to a focusing column. A mass filter allows for selection of a specific ion species and rapid changing from one species to another.

24 Claims, 8 Drawing Sheets

(56) References Cited

U.S. PATENT DOCUMENTS

| | | | |
|---|---|---|---|
| 8,080,791 B2* | 12/2011 | von Harrach et al. | 250/311 |
| 8,124,942 B2* | 2/2012 | Graupera et al. | 250/423 R |
| 8,168,957 B2 | 5/2012 | Keller et al. | |
| 8,253,118 B2* | 8/2012 | Zhang et al. | 250/492.21 |
| 8,278,027 B2* | 10/2012 | Scott et al. | 430/296 |
| 8,283,629 B1 | 10/2012 | Tuggle et al. | |
| 8,294,093 B1* | 10/2012 | Tuggle et al. | 250/296 |
| 8,405,054 B2 | 3/2013 | Smith et al. | |
| 8,410,439 B2 | 4/2013 | von Harrach et al. | |
| 8,455,822 B2* | 6/2013 | Rue | 250/309 |
| 2005/0183667 A1* | 8/2005 | Keller et al. | 118/723 I |
| 2005/0203438 A1* | 9/2005 | Manwaring et al. | 600/547 |
| 2007/0163500 A1* | 7/2007 | Kim et al. | 118/723 I |
| 2008/0050292 A1* | 2/2008 | Godyak | 422/186.29 |
| 2009/0230299 A1* | 9/2009 | Shichi et al. | 250/282 |
| 2009/0309018 A1* | 12/2009 | Smith et al. | 250/282 |
| 2011/0309049 A1* | 12/2011 | Papasouliotis et al. | 216/37 |
| 2012/0032092 A1* | 2/2012 | Graupera et al. | 250/396 R |
| 2012/0056088 A1 | 3/2012 | Rue | |
| 2012/0091360 A1 | 4/2012 | Zhang et al. | |
| 2012/0280136 A1 | 11/2012 | Zhang et al. | |
| 2012/0292497 A1 | 11/2012 | McGinn | |
| 2013/0015765 A1 | 1/2013 | Graupera et al. | |
| 2013/0040458 A1* | 2/2013 | Scott et al. | 438/669 |
| 2013/0250293 A1* | 9/2013 | Utlaut et al. | 356/316 |

OTHER PUBLICATIONS

Smith et al. [smith_2006_icp.pdf], J. Vac. Sci. Technol. B 24 No. 6, Nov./Dec. 2006, 2902-2906.*

Han et al., [balanced_antenna.pdf], Plasma Sources Sci. Technol. 22 (2013)1-6.*

C.D. Coath, et al., "A high-brightness duoplasmatron ion source for microprobe secondary-ion mass spectrometry," Rev. Sc. Instrum., Feb. 1995, pp. 1018-1023, vol. 66, No. 2.

* cited by examiner

INDUCTIVELY-COUPLED PLASMA ION SOURCE FOR USE WITH A FOCUSED ION BEAM COLUMN WITH SELECTABLE IONS

TECHNICAL FIELD OF THE INVENTION

The present invention relates to charged particle beam processing systems, and in particular, to a charged particle beam system having a selectable ion species.

BACKGROUND OF THE INVENTION

Focused ion beam (FIB) systems are used in a variety of applications in integrated circuit manufacturing and nanotechnology to create and alter microscopic and nanoscopic structures. FIB systems can use a variety of sources to produce ions. A liquid metal ion source (LMIS), for example, can provide high resolution processing, that is, a small spot size, but typically produces a low beam current.

A typical system using a gallium LMIS can provide five to seven nanometers of lateral resolution. Such systems are widely used in the characterization and treatment of materials on microscopic to nanoscopic scales. A gallium LMIS comprises a pointed needle coated with a layer of gallium. The needle is maintained at a high temperature while an electric field is applied to the liquid gallium to extract ions from the source.

A FIB system with a gallium LMIS can be used, for example, to image, mill, deposit, and analyze with great precision. Milling or micromachining involves the removal of bulk material at or near the surface. Milling can be performed without an etch-assisting gas, in a momentum transfer process called sputtering, or using an etch-assisting gas, in a process referred to as chemically-assisted ion beam etching. U.S. Pat. No. 5,188,705, which is assigned to the assignee of the present invention, describes a chemically-assisted ion beam etching process. In chemically-assisted ion beam etching, an etch-enhancing gas reacts in the presence of the ion beam to combine with the surface material to form volatile compounds. In FIB deposition, a precursor gas, such as an organometallic compound, decomposes in the presence of the ion beam to deposit material onto the target surface.

In all of the processes described above, the function of the gallium ions in the beam is to provide energy, either to physically displace particles on the work piece by sputtering or to activate a chemical reaction of a molecule adhered to the surface. The gallium itself does not typically participate in the reaction. Gallium is used in the beam because its properties, such as melting point, ionization energy, and mass, make it suitable to form into a narrow beam to interact with commonly used work piece materials. There are disadvantages to using a gallium LMIS. Gallium atoms implant into the work piece and, in many applications, produce undesirable side effects, such as changing the opacity or electrical properties of a work piece. Gallium can also disrupt the crystal structure in the area of bombardment. Also, to produce a very narrow beam, the current in a beam from an LMIS must be kept relatively low, which means low etch rates and longer processing times.

While it would be desirable to use different ion species for different applications, liquid metal ion sources are limited in the type of ions they can produce. Only metal species that have suitable melting point, ionization energy, and mass can be used, and this limits the ion species available from an LMIS. While it would also be desirable to be able to rapidly change ion species for different processing steps, changing the ion species of an LMIS requires removing the source from the vacuum chamber and replacing it with a different source, which must then undergo a time consuming preparation procedure. There are liquid metal alloy sources that provide ions of more than one type of metal. The types of ions available from such sources are limited to combination of metals that form alloys having suitable properties. Some liquid metal alloy systems, such as the one described in U.S. Pat. No. 5,165,954 to Parker, et al. for "Method for Repairing Semiconductor Masks & Reticles," are used with a mass filter that separates the ions of different species so that the beam impacting the target comprises a single species.

Some types of mass filters, such as an ExB filter or "Wien filter," use an electric field and a magnetic field, perpendicular to the electric field, that pass ions of the selected mass and energy through the filter, while ions having other masses, or energies, are deflected into a barrier. The deflection of an ExB filter depends on the energy of the ions, and there is always some energy variation in the beam, so the filter introduces chromatic aberration into the system, spreading the beam and reducing its resolution. Non-uniform fields within the mass filter also contribute to beam aberration.

Plasma ion sources ionize gas in a plasma chamber and extract ions to form a beam that is focused on a work piece. Plasma ion sources, such as a duoplasmatron plasma ion source described by Coath and Long, "A High-Brightness Duoplasmatron Ion Source Microprobe Secondary Ion Mass Spectroscopy," Rev. Sci. Instruments 66(2), p. 1018 (1995), have been used as ion sources for ion beam systems, particularly for applications in mass spectroscopy and ion implantation. Because of the energy spread of ions extracted from the plasma chamber, the ions of a duoplasmatron source cannot be focused to as small a spot as the ions from an LMIS. Duoplasmatron ion sources are used, for example, to implant ions over a large area or for time-of-flight mass spectroscopy. In time-of-flight mass spectroscopy, ions in the primary beam sputter ions from the surface, and the mass of each sputtered ions is determined by the time required for the sputtered ion to reach the detector. To obtain a precise measurement, it is necessary to known precisely when the ion in the primary beam impacts the surface. Many gases species consist of multiple isotopes having slightly different masses and because different isotopes in the primary beam will reach the specimen at different times, mass filtering is used to separate isotopes, so that a single isotope reaches the specimen at a precisely known time.

Recently, inductively coupled plasma (ICP) ion sources have begun to be used in FIB systems. Innovations in ICP sources have reduced chromatic aberration, allowing for higher resolution processing, which opens new opportunities for ion beam processing, including imaging.

Many different types of gases can be used in a plasma ion source to provide a variety of ions species, so the ion species can be optimized for different applications. For example, whereas helium ions are useful for imaging or light polishing, xenon ions provide higher milling rates that are useful for bulk processing. Plasma ion sources can produce ions of many different species and at larger currents, but beam resolution has been limited. When a user wants to change ion species in a plasma source, it is necessary to remove a first gas from the plasma chamber and replace it with a second gas. U.S. Pat. Pub. No. 2009/0309018 for "Multi-Source Plasma Focused Ion Beam System," which is assigned to the assignee of the present invention and is hereby incorporated by reference, describes a system for providing multiple gases to the plasma chamber to provide different ion species for performing different charged particle beam operations. Unfortunately, it can take up to 30 minutes to remove one gas from the plasma chamber and fill it with a second gas. A gas inlet for a plasma ion source typically has a small opening through which gas is supplied to maintain the pressure in the plasma chamber. Because the gas is used very slowly, the small opening to replenish the gas is very small. This makes for an unacceptably long time to change out the gas for many applications that process a work piece sequentially using different process gases.

FIG. 1 shows a typical prior art ICP ion source 100 for use with a FIB system such as the one described in U.S. Pat. Pub. No. 2009/0309018. Gas is provided to a plasma chamber 102 within a source tube 103 from an external gas feed line 104 through a gas filter 106 and then to a capillary tube 108 with a flow restriction 110. Energy is fed into the plasma chamber 102 from RF power supply 113 by antenna coils 114 and ions are extracted through a source electrode aperture 116 in a source electrode 118 by extractor electrode 120. A split Faraday shield 121 reduces the capacitive coupling between the coil 114 and the plasma in chamber 102, in chamber 102 which reduces the energy spread of the extracted ions. Power supply 113 preferably drives the antenna 114 in a "balanced" manner, that is, the electrical phase shift across the antenna is adjusted to reduce modulation of the plasma potential as described in U.S. Pat. Pub. No. 20080017319 of Keller et al. for a "Magnetically enhanced, inductively coupled plasma source for a focused ion beam system," which is assigned to the assignee of the present invention and which is hereby incorporated by references. The balanced antenna preferably provides a null point in the radio frequency energy field within the plasma, which reduces the energy spread of the ions extracted from plasma chamber 102.

The gas conductance into and out of the plasma chamber 102 is through the flow restriction 110 in the capillary tube (at the top of the source tube 103) and the aperture 116 (typically less than ¼ mm in diameter) in the source electrode 118. Pump 122 connected to gas supply line 104 through valve 123 removes gas from plasma chamber 102 through capillary 108 and gas supply line 104. An ion column pump (not shown) extracts gas from plasma chamber 102 through source electrode aperture 116. Multiple gas sources such as gas storage 130A, gas storage 130B, gas storage 130C and gas storage 130D supply gas into gas supply line 104 through corresponding valves 131A through 131D. A beam voltage supply 132 supplies a high voltage to the plasma in chamber 102 and an extraction voltage supply 134 supplies a voltage to extraction electrode 120. Extracted ions or electrons are focused by focusing electrode 136. Additional details of the focusing column and sample chamber are not shown.

To remove a gas from the interior of the plasma chamber, the gas feed line 104 is pumped as shown to remove gas in the source tube above the flow restriction 110 in the capillary tube 108. The volume of the FIB system below the source electrode 118 may also be adequately pumped using the main chamber vacuum pump(s) (not shown).

Because both the source electrode aperture 116 and the flow restrictor 110 have small diameters and correspondingly very low gas conductances, it is impossible to rapidly pump out the interior of the source tube 103. This is a disadvantage, particularly for a production FIB system where it is sometimes desirable to perform sequential process steps with different ion species. First, it may take a much longer time to pump out a first process gas from the source tube 103 before the base pressure is low enough to introduce a second process gas. Insufficient purging of the gas can lead to contamination of the plasma through ionization. U.S. patent application Ser. No. 13/182,187 for "Methods and Structures for Rapid Switching between Different Process Gases in an Inductively-Coupled Plasma (ICP) Ion Source" describes plasma chamber designs that provide for rapidly changing gas in a plasma source by providing an alternate path for gas to enter or leave the vacuum chamber.

Thus, providing high resolution beams of different ion species is limited by long gas exchange time or, in the case of a metallic alloy source, the metals present in the alloy which are typically limited by the ability to create such an alloy based on material compatibility.

SUMMARY OF THE INVENTION

An object of the invention is to provide a FIB system that provides for rapidly switching between different ion species.

In accordance a preferred embodiment of the invention, an ICP ion source is provided for a FIB column. The plasma ion source contains more than one type of gas to provide ions of different species. The ion species that comprises the focused beam is selected from the multiple ion species leaving the source using a mass filter.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
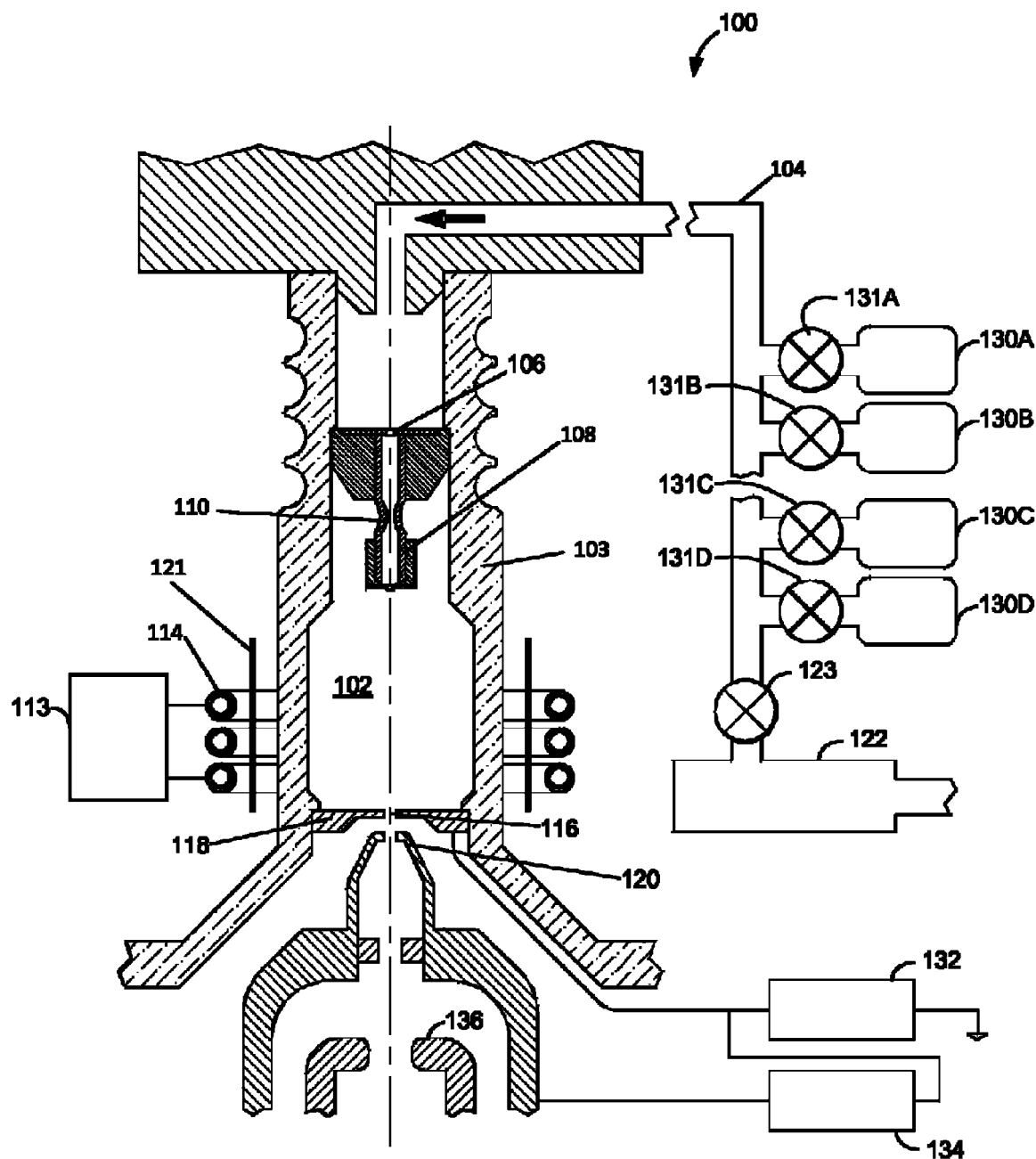
FIG. 1 shows a cross-sectional schematic view of a prior art FIB system using an ICP ion source.

A preferred embodiment comprises an ICP ion source having multiple gas species within the source and a mass filter for selecting from the multiple ion species extracted from the source an ion species to impact the target in a focused ion beam. The preferred embodiment provides a very broad range of mass and beam current choices for use across an almost limitless variety of applications. This differs from the mass filtering in, for example, time-of-flight mass spectroscopy, in which a single species is selected from multiple isotopes of slightly different masses. The combination of ICP source and mass filter provides a solution to the problem of providing a high resolution beam together with rapid switching between a wide choice of selectable ion species. The mass filter allows ions of different species to exit the source during beam formation, with a particular species selected while other species are rejected by means of the mass filter. Because the multiple gases are present in the plasma during operation, the ion species can be changed rapidly in less than one minute, less than one second, less than 0.5 second, or less than 0.1 sec, by simply changing the configuration of the mass filter.

A preferred mass filter is a Wien filter, also called an ExB filter because the beam travels through a region having a magnetic field and an electric field perpendicular to the magnetic field. Other types of mass filters, such as a quadrupole, a sector instrument, or a spherical capacitor, can also be used. The ICP plasma source and ExB mass filter, when combined with a mixed source gas, provides a method for generating a plasma comprised of ions from all source gases simultaneously. The gases can be introduced into the plasma chamber in a fixed ratio from a source of premixed gas or in a selectable ratio from individual gas sources. The mixed gas in the plasma chamber is not the result of contamination or of different isotopes of the same elements, but comprises different elements, each in sufficient quantities in the plasma to form a beam for processing a work piece.

While the ExB filter is known to introduce chromatic and other aberration into the beam, applicants have found that the energy variation among ions exiting the ICP plasma source is sufficiently small that the aberration introduced in the mass filtered beam and the focusing column is small, thereby providing a small spot size and high resolution processing. A preferred ICP produces ions of the same species having energy spread of less than 40 eV, more preferably less than 20 eV, and most preferably less than 6 eV. The combination of the ICP plasma source, the mass filter, and the ion column can provide an ion beam having a spot size less than 1 micron, less than 500 nm, less than 100 nm or less than 50 nm. The beam current at the work piece provided by the combination of the ICP and mass filter is typically between 1 pA and 10 µA. In one embodiment, the combination of ICP plasma source and mass filter is capable of providing a beam having a current of 10 µA with a spot size of less than 200 µm, less than 500 nm, or less than 100 nm. In another embodiment, the combination of ICP plasma source and is capable of providing a beam having a current of 1 µA with a spot size of less than 500 nm, less than 100 nm, or less than 50 nm. In another embodiment, the combination of ICP plasma source and is capable of providing a beam having a current of 10 nA with a spot size of less than 200 nm, less than 100 nm, or less than 25 nm. In another embodiment, the combination of ICP plasma source and is capable of providing a beam having a current of 1 pA with a spot size of less than 20 nm, less than 10 nm, or less than 5 nm. The beam resolution is improved by various combinations of lens mode operation, the split faraday shield and balanced antenna in the source and various techniques to reduce aberration in the mass filter. Depending on the resolution required for a specific application, not all of the resolution enhancing features will be used in every embodiment.

The ExB filter allows selection or rejection of one ion species from a mixed source to carry out specific operations which benefit from use of a specific ion, such as a light ion, a heavier ion, an inert ion, or a reactive ion. One embodiment uses a mixed gas of very light, mid-weight and heavy ions, such as neon, argon and xenon, which allows for a wide range of ion masses to cover a broad range of applications.

Some embodiments provide for the composition and/or ratio of the gases to be controlled by pre-mixing discrete gases externally in a common plenum prior to introduction into the plasma source. The common plenum is then connected via the gas supply line to the ion source. In other embodiments, the gases connect to the gas supply line from multiple individual gas sources, each containing a single gas species. Embodiments allow a broad range of power and pressure settings, which may preferentially increase the performance of one desired species over another while still maintaining ion species selection capability by use of the mass filter. For example different gases such as oxygen and xenon may be mixed with variable stoichiometry and may be further optimized through operation in different power and pressure regimes. In general, the lower limit of gas pressure is defined by the pressure corresponding to high voltage breakdown for the most limiting gas. It has been well established through exhaustive characterization by Paschen that a unique power and pressure relationship exists for numerous, specific gas species. This relationship defines the acceptable range of operation of that gas at a prescribed voltage and within a certain pressure range which will not result in high voltage breakdown of the gas Skilled persons will recognize that various combinations of source gases, operating pressures and power settings are achievable for a wide range of gas species or combination of gas species within the same plasma source and which are preferentially selectable either by mass filtering, or by careful regulation of power and pressure and in conjunction with further mass filtering.

In the above example, the most limiting gas is xenon which has a minimum inlet pressure requirement of approximately 1300 mbar before high voltage breakdown occurs. Conversely, oxygen has a much lower limit of approximately 500 mbar. In addition, there is a minimum power setting which is necessary to create and sustain a plasma based on the source gas species. For example, xenon is capable of sustaining plasma at input powers as low as 15 W while oxygen requires a minimum input power of approximately 150 W. One can operate a mixture of both xenon and oxygen either together with further mass filtering or independently simply by careful regulation of power and pressure parameters. A typical range of power and pressure for operation of such a source gas combination may range from 25 W to 1000 W at a pressure of between 500 mbar and 3000 mbar. A more preferred range of power and pressure may be from 100 W to 600 W and 1000 mbar to 2000 mbar. Or conversely, a power setting of 25 W to 100 W and pressure setting of 1500 mbar to 2000 mbar would result in the ability to preferentially generate only xenon plasma, even in the presence of oxygen, but without Paschen breakdown. In any event, the presence of the mass filter allows for removal of any undesired component of the plasma beam after it is extracted and focused. Operation of a wide range of source gas species has been demonstrated, ranging from light ion species such as neon, to middle weight ion species such as argon and reaching to heavy ion species such as xenon. Other source gases such as nitrogen and oxygen have been demonstrated. It should therefore be possible to operate the plasma source and mass filter with any combination of these gases by the method described. This implementation therefore allows great versatility, precise selection and ease of operation for different applications ranging from rapid material removal to light ion imaging. Using the information above as guidance, skilled persons can select appropriate power and pressure relationships for various gas combinations.

Regardless of how the multiple gases are supplied to the plasma chamber, embodiments provide for the immediate selection of ion species where otherwise, an exchange of source gases would be required in order to change the ion species required for a specific operation.

A benefit of some embodiments is that numerous gas mixtures, whether premixed or mixed in-situ in the gas supply line or plasma chamber, could be delivered. This is analogous to the ability to operate multiple alloy sources in one source assembly. For example, gas source could provide a mixture could be helium and xenon while another gas source could provide a mixture of could be hydrogen and oxygen. In some embodiments, one or more mass filters could be set to pass more multiple ion species to use, for example, for simultaneous imaging by light ions and milling by heavy ions, as described in U.S. patent application Ser. No. 13/223,276 of Rue et al. for "Navigation and Sample Processing Using an Ion Source Containing both Low-Mass and High-Mass Species," which is assigned to the assignee of the present invention and which is hereby incorporated by reference.

An additional benefit of some embodiments is the ability of the ICP source to deliver an extremely broad range of beam currents, thereby taking further advantage of the wide distribution of masses available and their very different imaging and milling characteristics.

Applicants have demonstrated the capability of an embodiment using air as the gas in the plasma chamber. The plasma is predominantly composed of nitrogen ions while the remainder would be predominantly composed of oxygen ions, with a small proportion of other elements such as argon and helium.

Figure 2A:
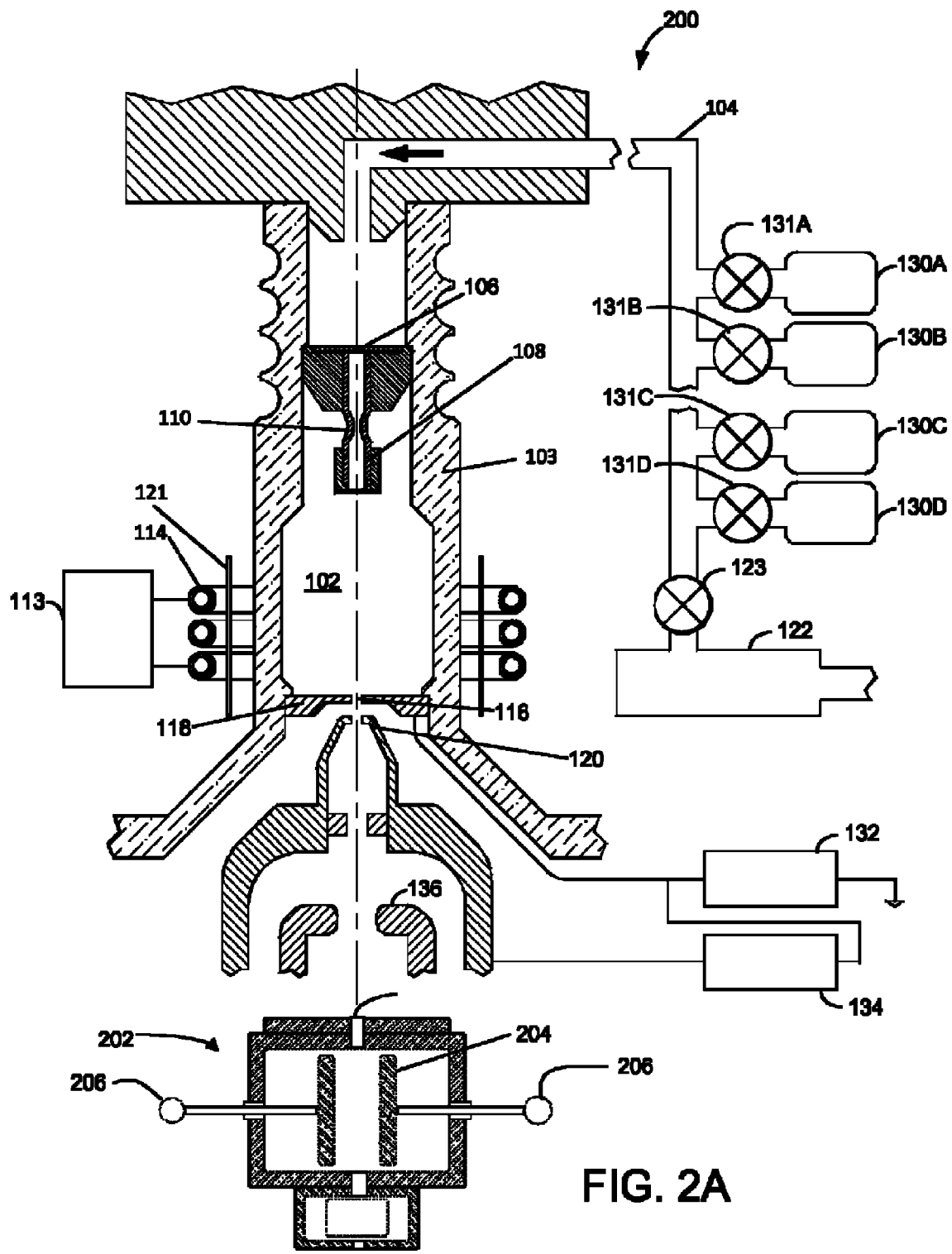
FIG. 2A shows a cross-sectional schematic view of a first embodiment of a FIB system using an ICP ion source and having a mass filter to select the ion species that impacts the sample.

FIG. 2A shows a FIB system 200 of the present invention. System 200 is similar to system 100 of FIG. 1, with the addition of a mass filter 202 below the ion source. As in FIG. 1, a preferred plasma source includes a split Faraday shield 121 to reduce capacitive coupling between the antenna and the plasma and reduce the energy spread of the extracted ions. A preferred plasma source also includes an antenna 114 driven in a balanced manner that adjusts the phase shift across the antenna to minimize or eliminate radio frequency modulation of the plasma potential. Mass filter 202 is preferably an ExB filter, although other types of mass filter can be used. Mass filter 202 include electrode 204 that provide an electric field and magnets (not shown) positioned above and below the plane of the paper to provide a crossing magnetic field. Connectors 206 provide electrical connections to electrodes 204 and provide a mechanical connection to adjust the position of the electrode 204. The fields are adjustable to select the mass of ions that pass through the filter undeflected and pass through an aperture in the beam path; ions having masses other than the selected mass will be deflected and will not pass through the aperture. While mass filter 202 is shown schematically, it could comprise a more complex mass filter or a compound filter having more than one region of ExB fields, separated along the beam axis. Valves 131A to 131D are adjusted to provide the desired gas mixture into gas feed line 104 to provide gas to the plasma chamber 106. Unlike the prior art, in which a single gas is typically supplied to plasma chamber 102 at any time, in embodiments of the invention, multiple ones of valves 131A to 131D may be open at the same time to provide multiple gas species to the plasma chamber simultaneously. Valves 131A to 131D are preferably metering valves that control the ratio of gases into gas inlet 104.

Figure 2B:
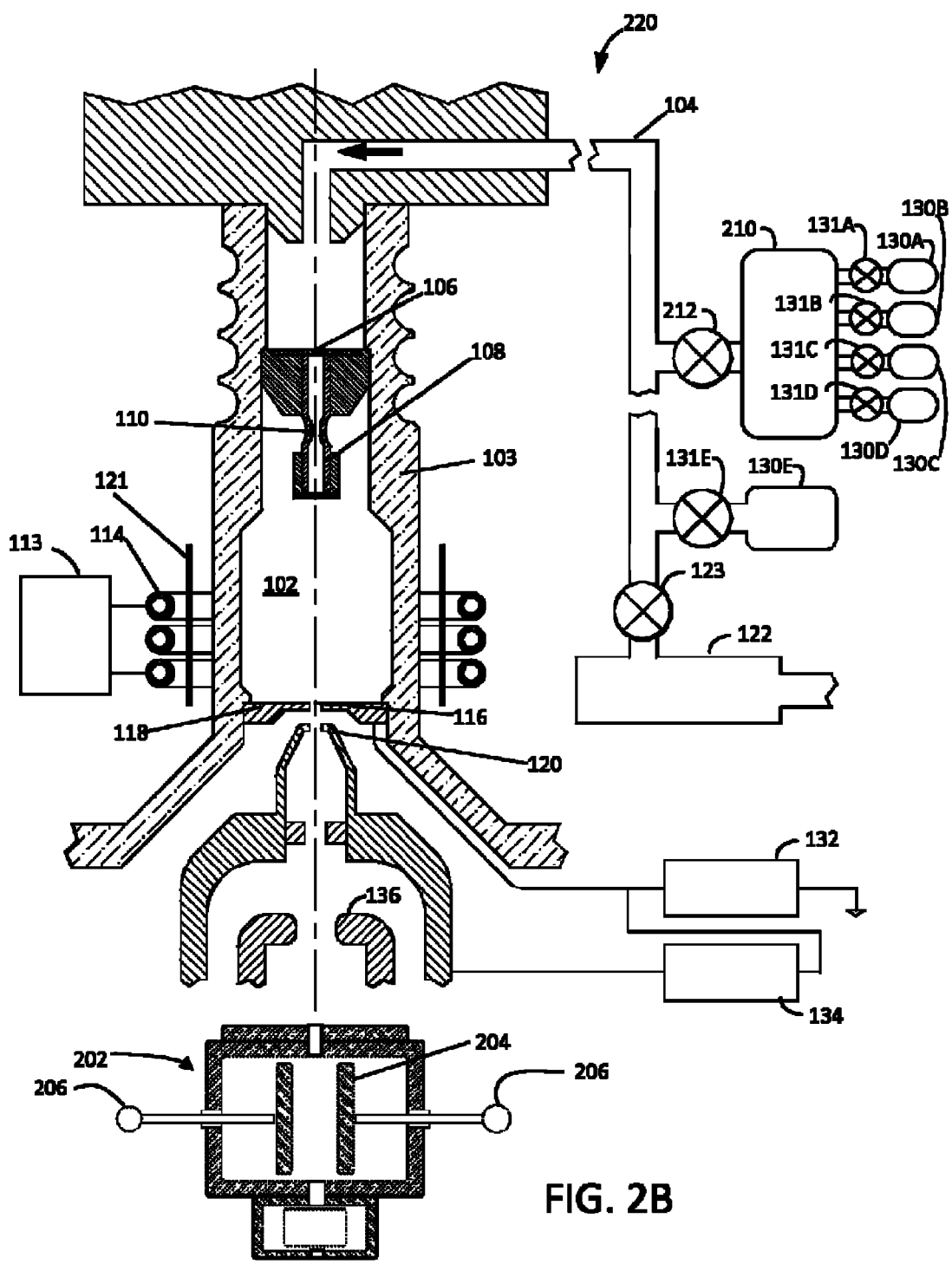
FIG. 2B shows a cross-sectional schematic view of a second embodiment of a FIB system using an ICP ion source and having a mass filter to select the ion species that impacts the sample.

FIG. 2B is similar to FIG. 2A except that some of the gas supplies 130A to 130D feed through valves 131A to valve 131D to a mixing plenum 210, in which the gas is premixed before passing through valve 212 into gas feed line 104 and into the plasma chamber 102. Gas supply 130E feeds directly into gas supply line 104. In various embodiments, any number of single gas supplies and of mixing plenums can be combined. Alternatively, a mixed gas source 210 can be prepared in another location and connected to valve 212, eliminating source 130A to 130E at the FIB system.

Figure 3:
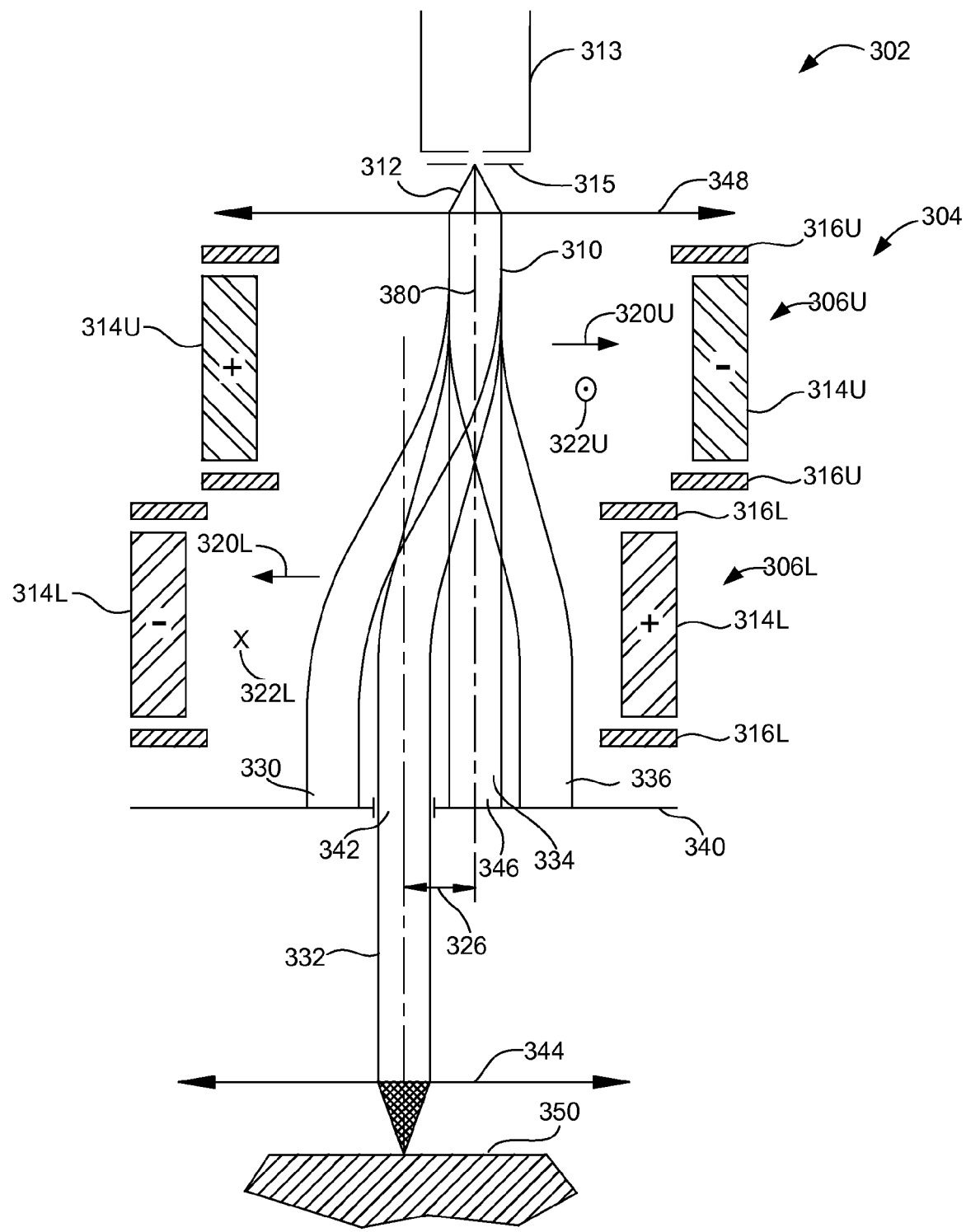
FIG. 3 shows an embodiment of a mass filter that uses an aberration corrected Wien ExB mass filter.

Mass filter 202 could comprise, for example, the mass filter shown in FIG. 3 and described in more detail in U.S. patent application Ser. No. 13/089,991 for "Aberration Corrected Wien ExB Mass Filter with Removal of Neutrals from the Beam," which is assigned to the assignee of the present invention and which is hereby incorporated by reference. FIG. 3 illustrates an ion column 302 having an aberration-corrected mass filter 304 having two stages, an upper ExB filter 306U and a lower ExB filter 306L. Ions 312 are drawn from an ICP plasma chamber 313 by an extraction electrode 315.

Ions 312 are then focused into a substantially parallel beam 310 by upper lens 348. In a completely parallel beam 310, the individual ion trajectories within the beam 310 may be extrapolated back to a virtual source (not shown) at minus infinity along the optical axis 380. A "substantially parallel" beam is a beam for which the virtual source is not necessarily at minus infinity, but for which the extrapolated ion trajectories still intersect the optical axis 380 at a location at least three times farther from the source tip (above or below) than the overall length of the ion column 302. Upper ExB filter 306U includes electrodes 314U, field termination plates 316U, and a magnetic field source (not shown).

Electrodes 314U produce an electric field in the plane of the figure, indicated by arrow 320U (pointing from the positive electrode 314U at the left towards the negative electrode 314U at the right—making the electric force on a positive ion towards the right). The magnetic field source produces a magnetic field coming out of the figure, indicated by circle 322U (making the magnetic force on a positive ion towards the left). Lower ExB filter 306L includes electrodes 314L, field termination plates 316L, and a magnetic field source (not shown). Electrodes 314L produce an electric field, indicated by arrow 320L in the plane of the figure, opposite in direction and equal in magnitude to electric field 320U in upper ExB filter 306U. The magnetic field source in lower ExB filter 306L produces a magnetic field going into the figure, as indicated by cross 322L, opposite in direction and equal in magnitude to magnetic field 322U in upper ExB filter 306U. Lower ExB filter 306L is symmetrical with upper ExB filter 306U, typically having an identical structure (rotated 180° and with a symmetry axis offset a distance 326) and producing opposite-direction and equal-magnitude electric and magnetic fields.

Ions 312 include four different ion species as shown: low mass ions 330, lower middle mass ions 332, upper middle mass ions 334, and upper mass ions 336. The low mass ions 330, upper middle mass ions 334, and upper mass ions 336 strike a mass separation aperture plate 340 and do not pass through aperture 342 down to the lower lens 344. The lower middle mass ions 332 pass through both the upper ExB filter 306U and lower ExB filter 306L as shown. Ions 332 then pass through the mass separation aperture 342 and are focused onto substrate surface 350 by the lower lens 344. In the prior art, ExB filters are typically tuned to pass the desired ions (lower middle mass in this example) without deflection. In the embodiment of FIG. 3, the desired ions are deflected to pass through aperture 342 and some of the undesirable ions (in this example, upper middle mass 334), along with the neutral particles, are undeflected and strike aperture plate 340. Other undesirable ions are deflected too much (low mass 330) or too little (high mass 336) to pass through aperture 342.

Neutral particles 346 are undeflected by the electric and magnetic fields in the ExB mass filter 304 and thus pass straight through, striking the mass separation aperture plate 340 because the hole 342 in the aperture plate 340 (which defines the exit axis of the ExB filter 304) is offset a distance 326 from the entrance axis 380 of the ExB filter 304. Although the schematic of FIG. 3 does not make it clear that there is no path to substrate 350 for neutral particles that are undeflected by lens 348, the geometry of an actual system eliminates such a path by various means familiar to those in the art, such as an aperture at the entrance to upper ExB filter 306U and/or an aperture somewhere in the column below mass filter 304. Commonly, the field termination plates 316U and 316L may be configured with openings for the ion beam to enter and exit through which are small enough to serve as apertures. Because the ions that impact aperture plate 340 are not focused onto a point, the wear on the aperture plate caused by ion sputtering is spread over a wider area. Thus aperture plate 340 is less likely to have an unwanted hole sputtered through the plate by the blocked ions, so aperture plate 340 will last longer.

In a preferred embodiment, upper ExB filter 306U and a lower ExB filter 306L are of the type describe in U.S. patent application Ser. No. 13/089,875 For "Wide Aperture Wien ExB Mass Filter," which is assigned to the assignee of the present invention and which is hereby incorporated by reference. Such an ExB filter includes magnetic poles that extend beyond the aperture to reduce fringe effects and provides an adjustable electric field having components both parallel and perpendicular to the magnetic field. The adjustable electric field can compensate for the non-ideal configuration of the physical electrodes to provide a wide optical aperture. The adjustable electric field can also provide in some embodiments the capability for both X-Y beam deflection, which can be used for beam alignment. The adjustable electric field can also provide in some embodiments beam stigmation, which can be used for correcting some of the aberrations induced by the mass filter.

Figure 4:
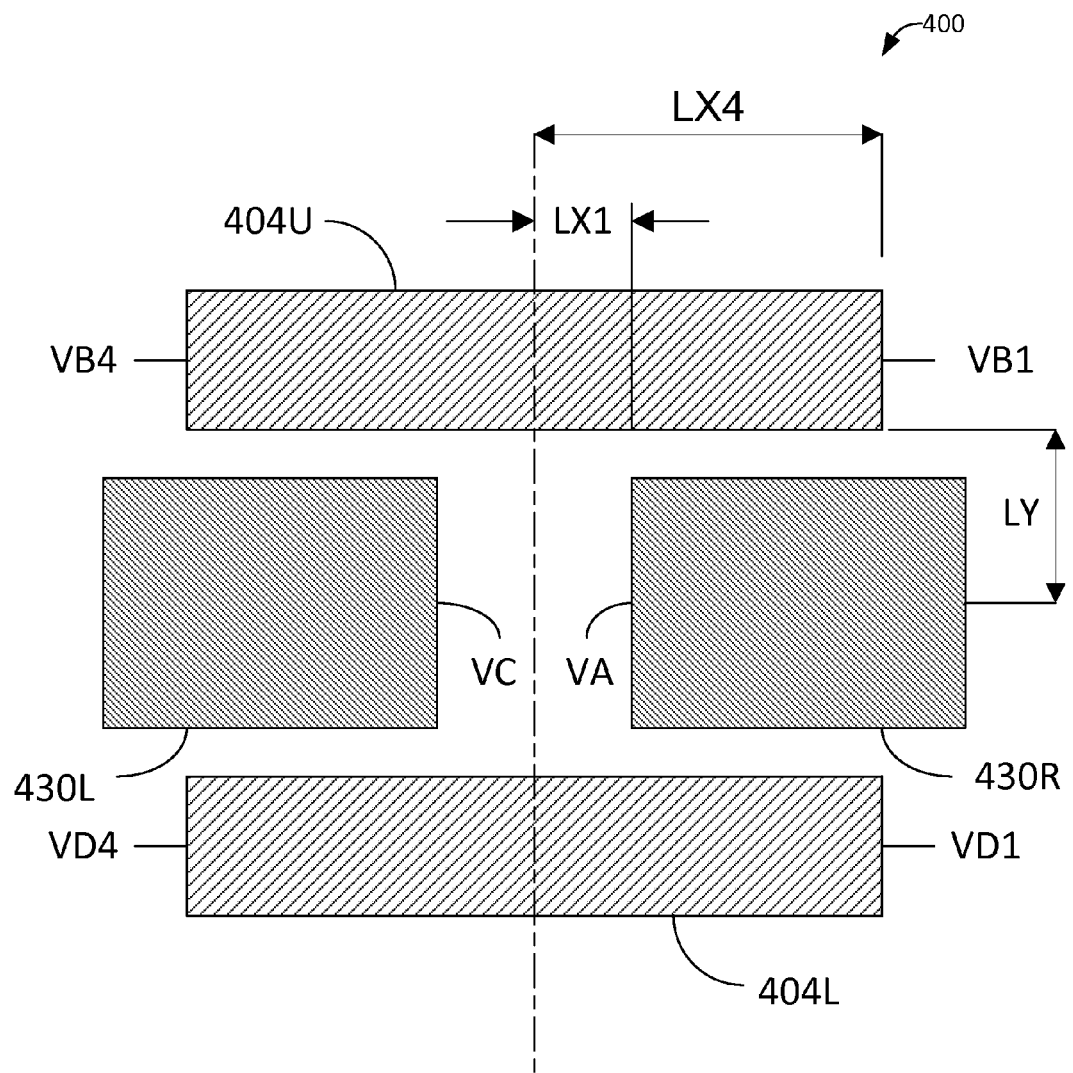
FIG. 4 shows an embodiment of a mass filter that uses two electrostatic pole pieces, each with a separate electrical connection.

FIG. 4 shows an embodiment of a mass filter 400 that uses two electrostatic pole pieces 430R and 430L, each with a separate electrical connection. Each of ExB filters 306U and 306L can comprise an ExB filter of the design shown in FIG. 4. Beam motion is assumed to be generally along the Z-axis (perpendicular to the plane of the figure). A first electric pole, 430R, is positioned on the +X-axis at a distance LX1 from the Y-axis (vertical centerline) with an applied voltage VA. A second electric pole 430L is positioned on the −X-axis at a distance −LX1 from the Y-axis with an applied voltage VC. The electric pole faces are oriented parallel to the Y-Z plane. The values of VA and VC would be chosen based on standard Wien filter operating considerations—see below.

There are two magnetic poles, 404U and 404L, positioned with their pole faces oriented parallel to the X-Z plane and at positions ±LY on the +Y and −Y-axes. The magnetic pole faces extend beyond the region defined by the electric plates and magnetic pole pieces. Either coils and/or permanent magnets may energize the pole pieces 404U and 404L, generating a magnetic field parallel to the Y-axis. The pole pieces 404U and 404L are fabricated from ferrite or some similar resistive magnetic material, typically in a resistivity range from $10^6$ to $10^8$ ohm-cm. The upper (+Y-axis) magnetic pole has two electrical connections, one at the +X end (VB1) and the other at the −X end (VB4). The lower (−Y-axis) magnetic pole also has two electrical connections, one at the +X end (VD1) and the other at the −X end (VD4). As described in U.S. patent application Ser. No. 13/089,875, voltages can be applied to the magnetic pole pieces to correct astigmatism induced by the crossed electric and magnetic fields in the mass filter. The voltage on the magnetic poles can also be applied to provide for electrostatic deflection of the beam in a direction parallel to the electric field or in a direction parallel to the magnetic field, which deflection can be used to align the beam in the column.

Figure 5:
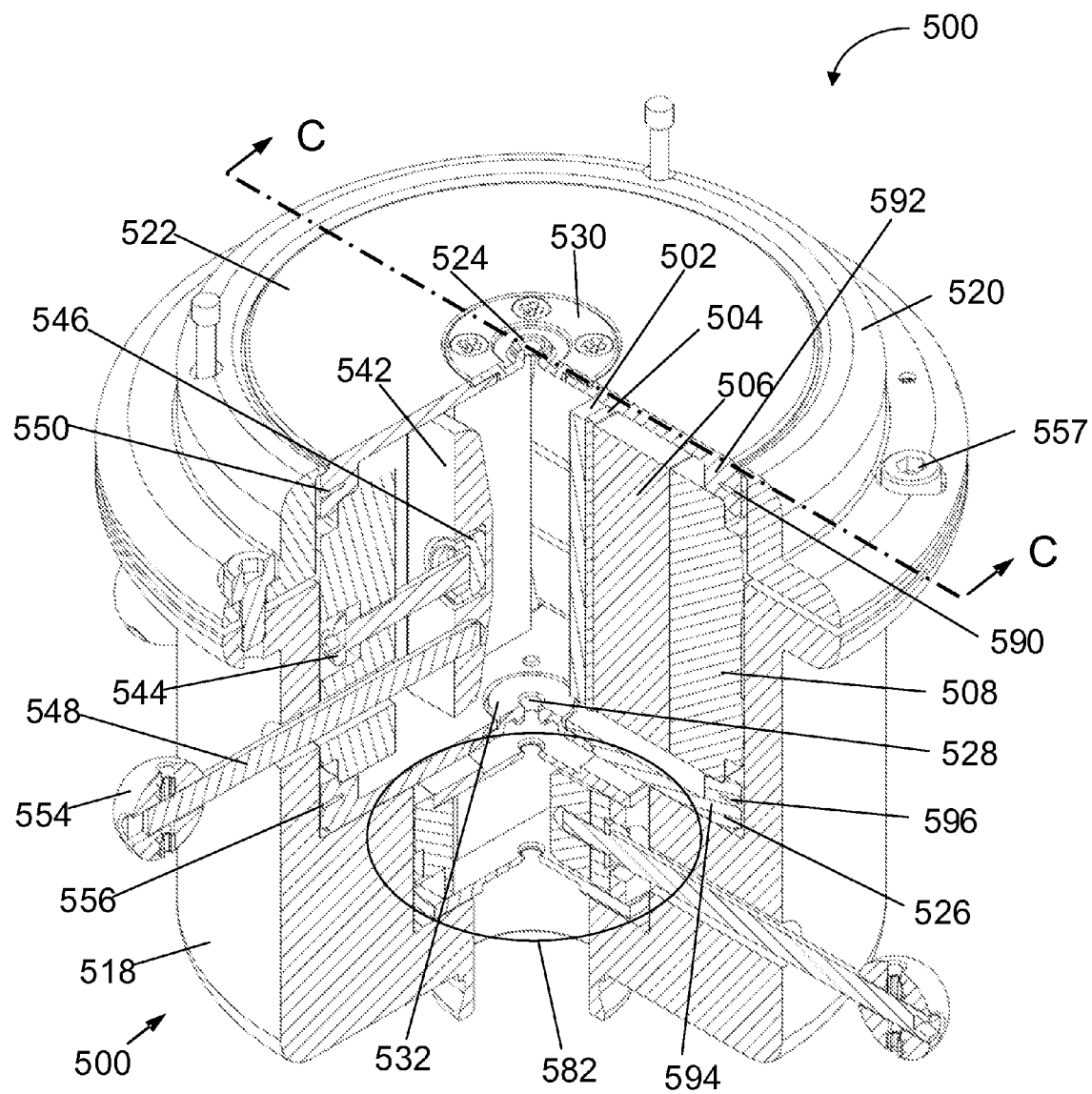
FIG. 5 shows an isometric quarter-cutaway view of an embodiment of an ExB mass filter used in some embodiments of the present invention.
Figure 6:
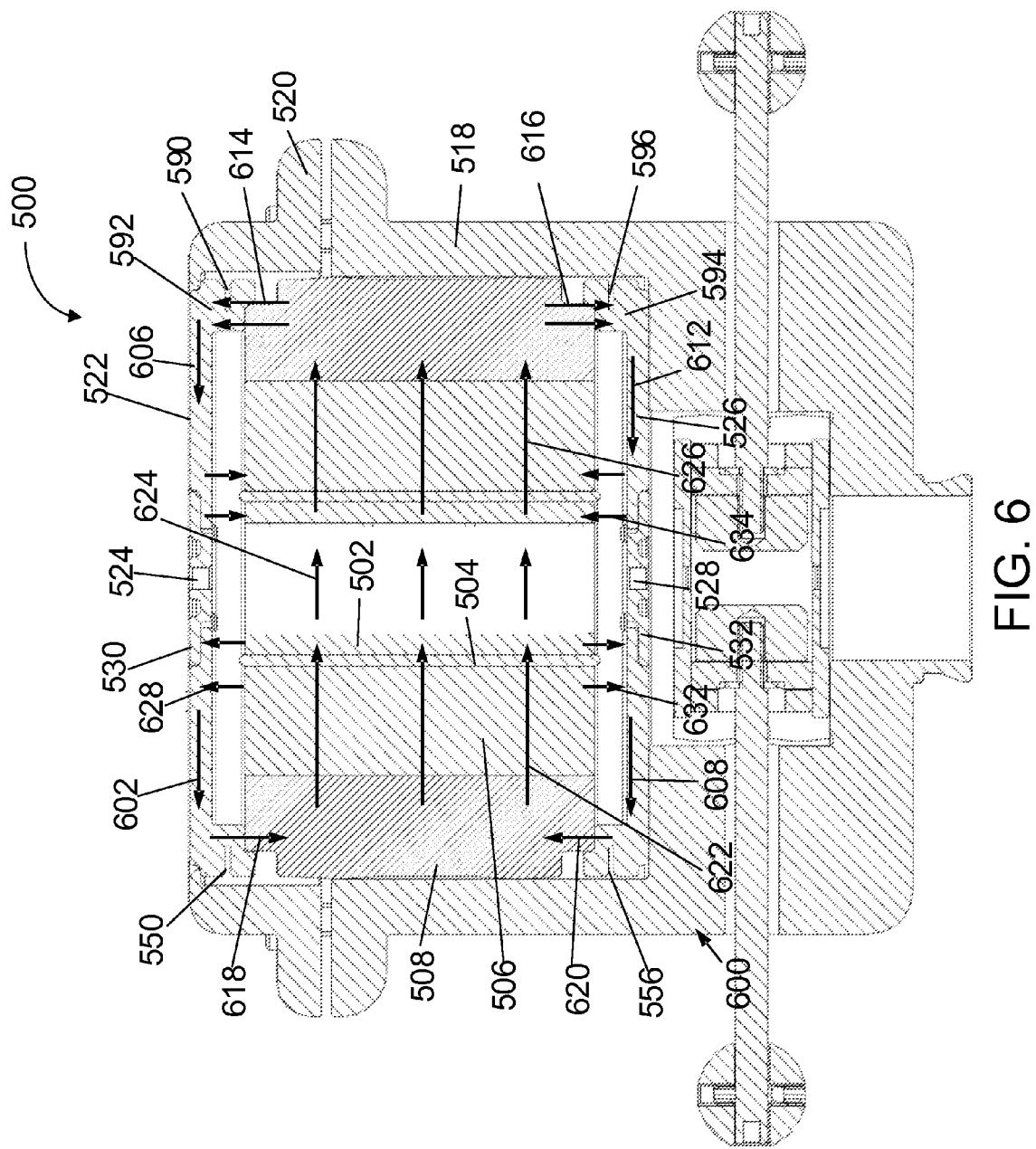
FIG. 6 shows the side cross-section of cut line C-C of FIG. 5 illustrating the magnetic circuit of an ExB mass filter used in some embodiments of the invention.

Some embodiments of the invention include a mass filter shown in FIGS. 5 and 6 and as described in U.S. patent application Ser. No. 13/111,634 for "Method and Structure for Controlling Magnetic Field Distributions in an ExB Wien Filter" which is assigned to the assignee of the present invention and which is hereby incorporated by reference. The mass filter of FIGS. 5 and 6 provides a structure and method for mechanically adjusting the magnetic field distribution and the entrance and exit apertures to achieve better matching between the electric and magnetic fields thereby equalizing the opposing electric and magnetic forces throughout the length of the ExB filter, including near the end caps and within the entrance and exit apertures.

As described in U.S. patent application Ser. No. 13/111,634 the ratio of the gap reluctance to the yoke reluctance should equal the ratio of the leak reluctance (i.e., the reluctance between the edges of the pole piece and the end caps) to the reluctance of the spacers. This design provides closer matching of the ratios by means of magnetic shims in the end caps and magnetic plug shims in the end rings, thereby providing flexibility in meeting the required B/E ratio throughout the length of an ExB than is possible merely by means of materials choices for the spacers or for the end caps.

FIG. 5 is an isometric quarter-cutaway view of an ExB mass filter 500 that can be used in an embodiment of the present invention. Section C-C is illustrated in FIG. 6. A magnetic pole piece 502 is attached to a ceramic insulator 504, which is attached to magnet 506, typically a neodymium-iron-boron (NdFeB) or samarium-cobalt (SmCo) alloy magnet, or other similar high strength permanent magnet. In alternative embodiments within the scope of the invention, electromagnet coils may be substituted for the permanent magnets 506 shown here. Magnets 506 (typically in a pair—only one is visible in the cutaway view 500) are attached to yoke 508, typically comprised of a relatively high saturation magnetic material, such as nickel-iron (e.g., NiFe43 or NiFe48).

In FIG. 5, the ion beam to be mass-separated would enter mass filter 500 through aperture 524 in entrance ring 530 mounted to entrance end cap 522. The various mass-separated ion beams would exit mass filter 500 through exit aperture 528 in exit ring 532 mounted to exit end cap 526. In general, the angular deflection of the non-selected ion species (i.e., those species not wanted in the ion beam to be focused on a sample) will be deflected along the E-field axis—from the lower left to the upper right of FIG. 5. This deflection in the majority of cases will be small enough that these non-selected ion beams will pass through exit aperture 528, to be blocked by a mass separation aperture (not shown) below the ExB mass filter. The selected ion beam will pass approximately through the center of exit aperture 528 and then through the mass separation aperture to be focused on the specimen. The magnetic field which performs the mass-separation of the ions beams is generated between the inner faces of the two pole pieces 502. These "gap fields" 624 are shown in FIG. 6.

Perpendicular to the B-field 624 (FIG. 6), an electric field is established between a pair of electrodes 542 which in the preferred embodiment shown are pressed inwards by mounting screws 544 (threaded into yoke 508) that push against insulators 546. Electrical connections to electrodes 542 are effected through rods 548 extending radially outwards through clearance holes in the yoke 508 and housing 518, and having corona-prevention balls 554 at the outer ends. The electrode and pole piece configuration shown corresponds to that shown in U.S. Pat. No. 4,789,787 issued Dec. 6, 1988 (see FIGS. 4A and 4B therein), which is incorporated by reference. The entrance end cap 522 has a thickened outer ring 592. Outer ring 592 has a radial slot 550 which serves to increase the axial reluctance of the outer ring. Magnetic shims 590 may be inserted into slot 550 to reduce the axial reluctance of the outer ring 592. Since the number, positions, and permeabilities of shims 590 are mechanically adjustable, it is possible to vary the reluctance of the outer ring 592 over a wide range in small increments, thereby enabling a much finer adjustment of the end cap reluctance than is possible in prior art ExB mass filters. Similar considerations apply to the radial slot 556 in exit end cap 526 having thickened outer ring 594 and magnetic shims 596.

A housing 518 encloses the yoke 508, with a clamping ring 520 (held down by screws 557) that compresses together end caps 522 and 526, and yoke 518. Below the ExB mass filter is an X-Y beam deflector 582 used for correction of beam deflection errors arising from the ExB mass filter 500. Mass filter 500 provides much closer matching of the B-field and E-field distributions than a conventional mass filter. This better matching is enabled by mechanically variable reluctances.

FIG. 6 is a side cross-section C-C of mass filter 500 illustrating the magnetic circuit of an ExB mass filter showing a preferred embodiment of the present invention. Arrows 602-634 illustrate the magnetic flux distribution within gaps, magnetic materials, and magnets. B-field 624 is "seen" by the ion beams passing through the ExB mass filter and generates the magnetic force on the ions which is generally opposite in direction and similar or identical in magnitude to the force induced by the E-field between the two electrodes 542 (one shown in FIG. 5). Fluxes 622 and 626 are between the pole pieces 502 and the yoke 508, passing through the magnets 506 and insulators 504. Within the entrance end cap 522 and entrance ring 530, fluxes 602 and 606 always flow to the left, corresponding to the direction of both the return flux flowing around the outside of the magnetic circuit, as well as connecting leakage fluxes 628 and 632 to the outer ends of magnets 506. Similarly, within exit end cap 526 and exit ring 532, fluxes 608 and 612 also always flow to the left, corresponding to the direction of both the return flux flowing around the outside of the magnetic circuit, as well as connecting leakage fluxes 632 and 634 to the outer ends of magnets 506. Fluxes 614 and 618 connect between the entrance end cap 522 and the yoke 508, passing through the outer ring 592 of end cap 522 and also any magnetic shims 590 within radial slot 550. Fluxes 616 and 620 connect between the exit end cap 526 and the yoke 508, passing through the outer ring 594 of end cap 526 and also any magnetic shims 596 within radial slot 556.

Now consider the B-fields inside the entrance aperture 524 within entrance ring 530. Unlike the prior art mass filters described above, in a mass filter according to the present invention, the magnetic field orientation and magnitude within the entrance and exit apertures can be adjusted to match the electric and magnetic fields thereby equalizing the opposing electric and magnetic forces throughout the length of the ExB filter. As shown in FIG. 6, the numbers, positions and permeabilities of magnetic shims 590 have been adjusted to cancel out the B-field within entrance aperture 524, thus no flux is shown across aperture 524.

As discussed above, the function of the entrance end cap 522 and entrance ring 530 is to terminate both the B-field and the E-field, ideally with approximately the same rate of decrease as a function of distance along the axis of the ExB mass filter, thereby preserving the correct B/E ratio. Since the entrance end cap 522 and entrance ring 530 have good electrical conductivity, the E-field tends to be terminated fairly abruptly and generally with essentially no E-field within aperture 524. For correct ExB operation, the B-field strength should be proportional to the E-field (with the same ratio everywhere on-axis), so the B-field should drop off to approximately zero strength within aperture 524, as well. Similar considerations apply to the B-field inside aperture 528 in exit ring 532 mounted to end cap 526. Unlike the prior art mass filters described above, in preferred embodiments of the present invention, the B-field within entrance and exit apertures 524, 528 can be made to drop to approximately zero strength in proportion to the E-field. Using the invention described herein, along with suitable choices of material with which to fabricate entrance end cap 522, exit end cap 526, entrance ring 530, exit ring 532, magnetic shims 590 and magnetic shims 596, it is now possible to cancel out the B-field within the entrance 524 and exit 528 apertures to less than one percent of the maximum B-field in the gap between pole pieces 502. Exemplary suitable materials for the end caps, rings, and shims include materials with moderate permeabilities such as 400-series stainless steel, in particular alloy SS430.

Mass filter 500 enables a mechanical method and structure for achieving good matching of the E-fields and B-fields at the ExB entrance and exit. Better matching reduces aberrations in the ExB mass filter and also enables better beam alignment exiting from the mass filter as is familiar to those skilled in the art. A preferred embodiment of FIB system may include a mass filter having any combination of the features of the mass filters shown in FIG. 3 to FIG. 6.

Figure 7:
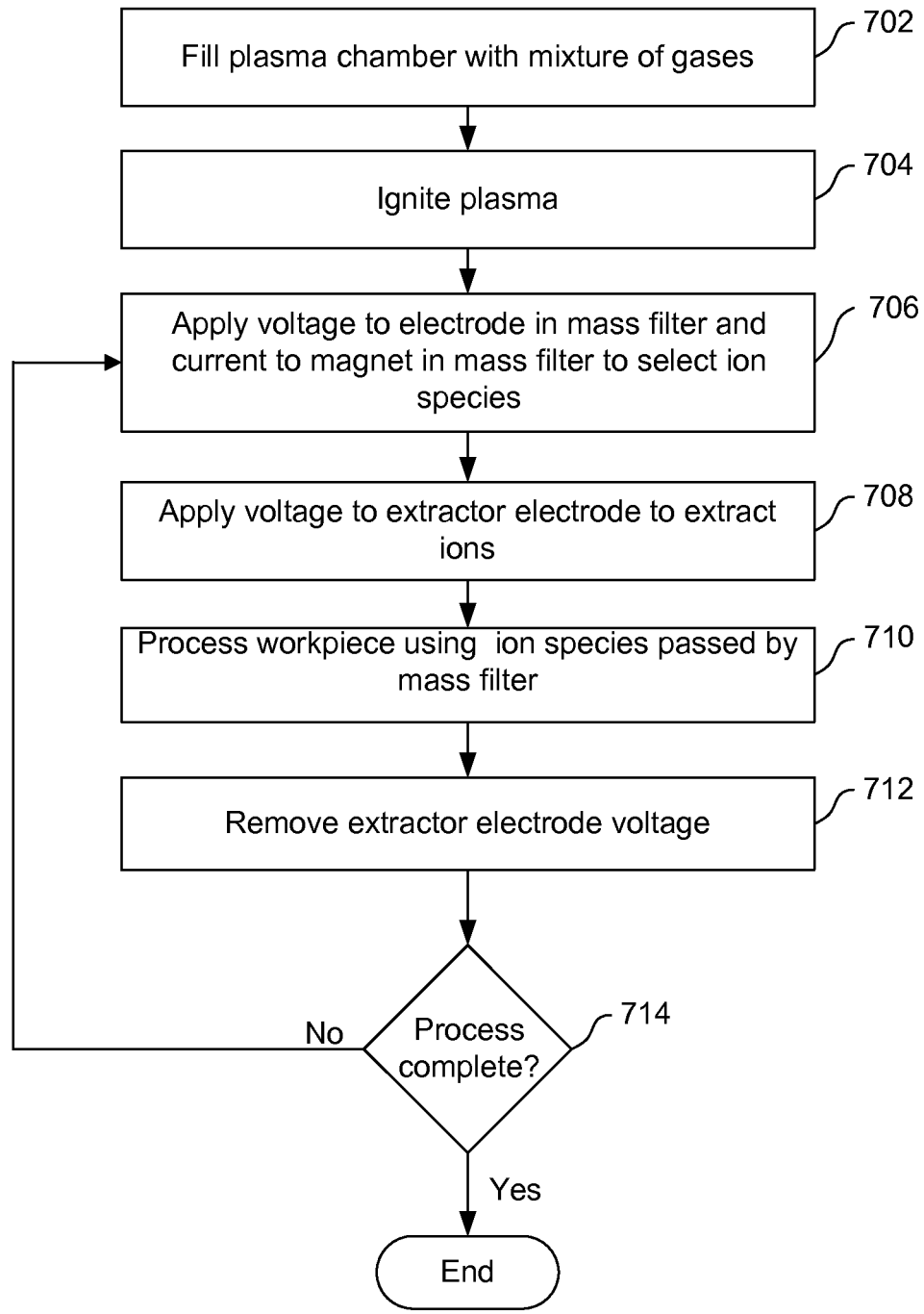
FIG. 7 shows a flow chart of the preferred method in accordance with the present invention.

FIG. 7 shows a preferred method in accordance with the present invention. In step 702, the plasma chamber is filled with a mixture of gases. For example, the gases might include helium and xenon gases, where helium could be used for imaging or light polishing, while xenon could provide relatively high milling rates for bulk processing. The gases could be pre-mixed in a container; the gases could come from different containers, or any combination of the two. In step 704, a plasma is ignited in the plasma chamber. In step 706, a first voltage is applied to the electrode of the mass filter to produce an electric field in the mass filter and a first current is applied to the electromagnet to produce a magnetic field in the mass field, the magnetic field being perpendicular to the electric field. The electric field and the magnetic field are tuned to pass a first ion species and to deflect the other ion species into a blocking structure.

In step 708, a voltage is applied to the extractor electrode to extract ions form the plasma chamber. In step 710, a work piece is processed by focusing the extracted first ion species. While ions of multiple species are extracted from the plasma source, the mass filter will pass only the first ion species to process the work piece. The ions selected to process the work piece can be non-reactive ions that remove material by sputtering, that is, momentum transfer to the substrate, or the ions can activate a precursor gas to etch or deposit material. Alternatively, the ions in the beam can themselves be reactive and include can etch without sputtering. For example, ions in the beam may have insufficient energy to sputter material and but may have sufficient energy to initiate a chemical reaction with the substrate material to form a volatile compound. Such low energy reactive ions reduce damage to the work piece and can selectively remove specific materials from the work piece. In other embodiments, reactive ions may have sufficient energy to sputter as well as to induce a chemical reaction. Operations that the ion species can perform include imaging, fine milling, coarse milling, or deposition.

When one step of the sample processing is complete, the extraction voltage is removed from the extractor electrode in step 712. In decision block 714, it is determined whether processing is complete. If additional processing is required, the process returns to block 706. If a different species of ion is required for the next operation, a second voltage is applied to the electrode of the mass filter to produce a second electric field in the mass filter and a second current is applied to the electromagnet to produce a second magnetic field in the mass field, to select a second ion species. The work piece is processed in step 710 using the second ion species. Multiple ion species are extracted from the ICP ion source during each processing step, but only the selected species passes through the mass filter and impinges on the work piece.

In decision block 714, if is determined that an additional processing step is required, the process repeats in step 706. If a different species of ion is required for the next operation, a third voltage is applied to the electrode of the mass filter to produce a third electric field in the mass filter and a third current is applied to the electromagnet to produce a third magnetic field in the mass field, to select a third ion species. The work piece is processed in step 710 using the third ion species. As in each processing step, multiple ion species are extracted from the ICP ion source during each processing step, but only the selected species passes through the mass filter and impinges on the work piece. If necessary, an additional gas species can be added to the plasma chamber from a source of single gas or mixed gas.

As describe above, in some embodiments, an ion species may be selected without using a mass filter by adjusting the gas pressure in the plasma chamber and the power so that one or more species in the gas mixture forms a plasma and one or more species in the gas mixture does not form a plasma. In such embodiments, a mass filter can still be used to prevent unwanted components that exit the plasma chamber from reaching the specimen. The pressure of the gasses in the chamber and/or the power can be altered to change which gases for the plasma, thereby changing the type of ions that can be extracted. In some embodiments the ions produced are controlled by the pressure of the gases in the plasma chamber and the radio frequency power inductively applied into the plasma chamber to control which gases form a plasma. For example, a method of processing a work piece with focused ion beam system having an inductively coupled plasma ion source, can comprise providing a plasma chamber including multiple gases; inductively coupling radio-frequency power from an antenna into the plasma chamber, the radio-frequency power being sufficient to maintain a plasma of a first group of at least one of the multiple gases and insufficient to maintain a plasma from a second group of at least one of the multiple gases; extracting ions of the first group from the plasma chamber; and focusing the extracted ions onto a work piece. Some embodiments further comprise configuring a mass filter to pass one or more gases from the first group and to stop ions other than the one or more gases from the first group.

Some embodiments further comprise altering the radio frequency power inductive coupled in to the plasma chamber or altering the pressure of one or more of the gases in the plasma chamber so that at least one of the gases in the first group does not form a plasma or so that one or more gases in the second group does form a plasma. Some embodiments further comprise extracting from the plasma chamber a group of ions different from ions of the first group.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
   an inductively coupled plasma ion source;
   one or more gas sources for providing multiple gases to the plasma ion source to produce multiple ion species simultaneously from the plasma ion source;
   a mass filter to select an ion species from the multiple ion species produced by the plasma ion source; and
   focusing optics to produce a focused beam of the selected ion species at a target, the beam having a submicron diameter at the target.

2. The charged particle beam system of claim 1, wherein the mass filter comprises an ExB filter.

3. The charged particle beam system of claim 1, wherein the inductively coupled plasma ion source includes a split Faraday shield.

4. The charged particle beam system of claim 1, wherein the inductively coupled plasma ion source includes balanced antenna.

5. The charged particle beam system of claim 1, wherein the one or more gas species comprises two gas species.

6. The charged particle beam system of claim 1, wherein the mass filter comprises an aberration corrected ExB mass filter.

7. The charged particle beam system of claim 6, wherein the aberration corrected ExB mass filter has multiple stages, a first ExB filter stage and at least a second ExB filter stage.

8. The charged particle beam system of claim 1, wherein said mass filter includes at least two electrostatic pole pieces, each having a separate electrical connection.

9. The charged particle beam system of claim 1, wherein said mass filter further comprises mechanically adjustable magnetic field distribution and entrance and exit apertures.

10. The charged particle beam system of claim 9, wherein said mass filter further comprises least two magnetic poles, each magnetic pole having two electrical connections, one electrical connection at each end of each magnetic pole.

11. The charged particle beam system of claim 1, in which the focusing optics focus a mass filtered ion beam to a spot size of less than 100 nm at a beam current of 10 µA.

12. The charged particle beam system of claim 1, in which the focusing optics focus a mass filtered ion beam to a spot size of less than 50 nm at a beam current of 1 μA.

13. The charged particle beam system of claim 1, in which the focusing optics focus a mass filtered ion beam to a spot size of less than 25 nm at a beam current of 10 nA.

14. A method of processing a work piece with focused ion beam system having an inductively coupled plasma ion source, comprising:
    extracting multiple ion species simultaneously from a plasma chamber of an inductively coupled plasma ion source;
    configuring a mass filter to select one of the multiple ion species extracted from the plasma chamber;
    focusing the selected one of the ion species onto a work piece to execute a first process on the work piece;
    configuring the mass filter to select another of the multiple ion species extracted from the plasma chamber; and
    focusing the other one of the ion species onto a work piece to execute a second process on the work piece.

15. The method of claim 14 in which the mass filter comprises an ExB filter and in which configuring the mass filter comprises applying a specified voltage to the electrode in the mass filter and a specified current to the electromagnet in the mass filter.

16. The method of claim 15 in which extracting multiple ion species simultaneously from a plasma chamber of an inductively coupled plasma ion source includes extracting multiple ion species simultaneously from a plasma chamber of an inductively coupled plasma ion source having a split faraday shield.

17. The method of claim 15 in which extracting multiple ion species simultaneously from a plasma chamber of an inductively coupled plasma ion source includes extracting multiple ion species simultaneously from a plasma chamber of an inductively coupled plasma ion source having a balanced antenna.

18. The method of claim 15 in which:
    extracting multiple ion species simultaneously includes extracting helium and argon;
    configuring a mass filter to select one of the multiple ion species extracted from the plasma chamber including configuring the mass filter to select argon ions; and
    focusing the selected one of the ion species onto a work piece to execute a first process on the work piece includes focusing a beam of argon ions having a current of greater than 1 μA onto a spot having a diameter smaller than 50 nm.

19. The method of claim 14 in which configuring a mass filter to select one of the multiple ion species extracted from the plasma chamber or configuring the mass filter to select another of the multiple ion species extracted from the plasma chamber includes configuring the mass filter to select more than one ion species.

20. A method of processing a work piece with focused ion beam system having an inductively coupled plasma ion source, comprising:
    providing a plasma chamber including multiple gases;
    inductively coupling radio-frequency power from an antenna into the plasma chamber, the radio-frequency power being sufficient to maintain a plasma of a first group of at least one of the multiple gases and insufficient to maintain a plasma from a second group of at least one of the multiple gases;
    extracting ions of the first group from the plasma chamber; and
    focusing the extracted ions onto a work piece.

21. The method of claim 20 further comprising configuring a mass filter to pass one or more gases from the first group and to stop ions other than the one or more gases from the first group.

22. The method of claim 20 further comprising altering the radio frequency power inductive coupled in to the plasma chamber or altering the pressure of one or more of the gases in the plasma chamber so that at least one of the gases in the first group does not form a plasma or so that one or more gases in the second group does form a plasma.

23. The method of claim 22 further comprising extracting from the plasma chamber a group of ions different from ions of the first group.

24. The charged particle beam system of claim 1 further comprising an extraction electrode to draw the multiple ion species from the plasma ion source toward the mass filter.

* * * * *